(12) United States Patent
Lozhkin

(10) Patent No.: US 8,798,199 B2
(45) Date of Patent: Aug. 5, 2014

(54) COMPOSITE POWER AMPLIFIER, TRANSMITTER, AND COMPOSITE-POWER-AMPLIFIER CONTROL METHOD

(75) Inventor: Alexander N. Lozhkin, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 317 days.

(21) Appl. No.: 13/351,947

(22) Filed: Jan. 17, 2012

(65) Prior Publication Data
US 2012/0224653 A1 Sep. 6, 2012

(30) Foreign Application Priority Data
Mar. 1, 2011 (JP) ................................. 2011-044052

(51) Int. Cl.
| | |
|---|---|
| H04L 25/49 | (2006.01) |
| H03F 3/68 | (2006.01) |
| H03F 1/02 | (2006.01) |
| H04L 27/36 | (2006.01) |
| H03F 3/24 | (2006.01) |
| H03F 1/32 | (2006.01) |
| H04L 25/03 | (2006.01) |

(52) U.S. Cl.
CPC ........ *H03F 1/0294* (2013.01); *H03F 2200/336* (2013.01); *H04L 27/367* (2013.01); *H03F 3/24* (2013.01); *H04L 25/03834* (2013.01); *H03F 1/3294* (2013.01)
USPC ........... 375/297; 375/296; 375/295; 375/260; 375/267; 375/278; 375/285

(58) Field of Classification Search
CPC ............... H03F 1/0294; H03F 1/3247; H03F 2201/3233; H03F 3/24; H03F 1/3241; H03F 1/0222; H03F 1/0288; H03F 1/3282; H03F 1/56; H03F 1/3229; H03F 2200/451; H03F 1/025; H03F 1/3252; H03F 3/211; H03F 1/32; H03F 1/3223; H04L 27/364; H04L 27/368; H04L 25/03343; H04B 1/0475; H04B 2001/0433; H03G 3/3042; H04W 52/42
See application file for complete search history.

(56) References Cited

U.S. PATENT DOCUMENTS 5,365,187 A * 11/1994 Hornak et al. .................. 330/10
(Continued)

FOREIGN PATENT DOCUMENTS

| | | |
|---|---|---|
| JP | 2006-060451 A | 3/2006 |
| WO | WO-2008/114346 | 9/2008 |

OTHER PUBLICATIONS

Garcia-Dicar, P. et al.: "An Imbalances Cancellation Method With Memory in a LINC Transmitter for Wideband Systems"; Vehicular Technology Conference; Sep. 25-28, 2005; pp. 1930-1934.*

(Continued)

*Primary Examiner* — Shuwang Liu
*Assistant Examiner* — Ross Varndell
(74) *Attorney, Agent, or Firm* — Fujitsu Patent Center

(57) ABSTRACT

C-HPA separates an input signal into separated signals, and amplifies and combines the separated signals. The C-HPA includes a plurality of signal splitters, a delay discrepancy estimator, and a delay discrepancy adjuster. Each of the signal splitters splits each of the separated signals into a signal in which a time component of the separated signal is put ahead a predetermined time and a signal in which the time component is delayed the predetermined time, and outputs split signals. The delay discrepancy estimator uses the input signal, the split signals output from each of the signal splitters and the combined output signal to estimate delay discrepancy between the separated signals. The delay discrepancy adjuster uses the estimated delay discrepancy to adjust the delay discrepancy between the separated signals.

6 Claims, 8 Drawing Sheets

(56) References Cited

U.S. PATENT DOCUMENTS

| | | | |
|---|---|---|---|
| 5,990,738 A * | 11/1999 | Wright et al. | 330/149 |
| 6,201,828 B1 * | 3/2001 | El-Tarhuni et al. | 375/150 |
| 7,385,541 B2 | 6/2008 | Itahara | |
| 2002/0027958 A1 * | 3/2002 | Kolanek | 375/297 |
| 2004/0088609 A1 * | 5/2004 | Eckhardt et al. | 714/700 |
| 2009/0295473 A1 * | 12/2009 | Dupuy et al. | 330/124 R |

OTHER PUBLICATIONS

Edmund, W C. "A Mixed Signal Approach Towards Linear and Efficient N-Way Doherty Amplifiers", IEEE Trans on Microwave Theory and Techniques, vol. 55, No. 5, May 2007, pp. 866-879.

García, Paloma "Adaptive digital correction of gain and phase imbalances in LINC transmitters", 2004.

Hakala, Ilkka et al., "A 2.14-GHz Chireix Outphasing Transmitter", IEEE Trans on Microwave Theory and Techniques, vol. 53, No. 6, Jun. 2005, pp. 2129-2137.

Qurehi, J. H. et al., "90-W Peak Power GaN Outphasing Amplifier With Optimum Input Signal Conditioning", IEEE Trans on Microwave Theory and Techniques, vol. 57, No. 8, 2009, pp. 1-12.

* cited by examiner

US 8,798,199 B2

COMPOSITE POWER AMPLIFIER, TRANSMITTER, AND COMPOSITE-POWER-AMPLIFIER CONTROL METHOD

CROSS-REFERENCE TO RELATED APPLICATION

This application is based upon and claims the benefit of priority of the prior Japanese Patent Application No. 2011-044052, filed on Mar. 1, 2011, the entire contents of which are incorporated herein by reference.

FIELD

The embodiment discussed herein is directed to a composite power amplifier, a transmitter, and a composite-power-amplifier control method.

BACKGROUND

There is a requirement for an increase in an output power of a base station with an increase in an amount of communication data in wireless communication. As a device for increasing the output power of the base station, there is a High Power Amplifier (HPA). The HPA is required not only for the increase in the output power but also for a high power efficiency. Recently, therefore, in order to amplify the output power and to improve the power efficiency, a high power amplifier has been introduced as a Composite-High Power Amplifier (C-HPA) that includes a plurality of HPAs.

FIG. 6 is a block diagram of LINC (LInear amplification with Nonlinear Components) based on a related example. As illustrated in FIG. 6, LINC 200 includes two amplifiers 241 and 242. In the LINC 200, an input signal is separated by a signal component separator 210, and the separated signals pass through D/A (Digital to Analog) converters 221 and 222, quadrature modulators 231 and 232, and the amplifiers 241 and 242, respectively, and are then combined by an adder 250. During the process, different transport delays $\tau_1$ and $\tau_2$ occur in the arms along which the two separated signals reach the two amplifiers 241 and 242, respectively. An output signal y of the LINC 200 represents the vector sum of output signals $y_1$ and $y_2$ of the amplifiers 241 and 242, respectively. Therefore, in order that the LINC 200 generates the output signal y without any distortions due to combining, it is desirable that the imbalance for amplitudes, phases, and delays between the two arms are compensated.

Of imbalances for amplitudes, phases, and delays, the imbalance for amplitudes and phases may be compensated by the LINC. FIG. 7 is a diagram of a process in which the LINC based on the related example compensates the imbalance for amplitudes and phases. As illustrated in FIG. 7, LINC 300 has substantially the same configuration as that of the LINC 200 illustrated in FIG. 6, except for compensators 361 and 362 provided in the arms, respectively. Therefore, the detailed description of the LINC 300 is omitted. The compensators 361 and 362 multiply signals input from signal component separators 310 and 390 by predetermined different complex coefficients $K_1$ and $K_2$, respectively, to compensate the imbalance for amplitudes and phases between the arms. However, it is difficult for the LINC 300 to compensate the delays in the arms.

A DPD (Digital PreDistorter) that includes a DLL (Delay Looked Loop) circuit is a technology for compensating delays occurring in the amplifiers, however, the DLL is a technology for compensating individual delays occurring in the arms. Therefore, delay discrepancy between the amplifiers is difficult to be adjusted. In the case of the C-HPA such as LINC, if amplified signals are combined before the delay discrepancy is adjusted, an output spectrum degrades at out-of-band frequencies. In other words, at the out-of-band frequencies, in order to reduce interference with adjacent channels or to improve the use efficiency of the frequencies, it is preferable to decrease out-of-band spectrum. However, when the delay discrepancy has occurred between the amplifiers, the level of the out-of-band spectrum significantly increases at such a value that the out-of-band frequency exceeds 10 MHz.

SUMMARY

According to an aspect of an embodiment of the invention, a composite power amplifier that separates an input signal into separated signals, and amplifies and combines the separated signals, the composite power amplifier includes: a plurality of signal splitters that split each of the separated signals into a signal in which a time component of the separated signal is put ahead a predetermined time and a signal in which the time component of the separated signal is delayed the predetermined time, and outputs split signals; an estimator that estimates delay discrepancy between the separated signals by using the input signal, the split signals output from each of the signal splitters, and the combined output signal; and an adjustor that adjusts the delay discrepancy between the separated signals by using the estimated delay discrepancy.

The object and advantages of the embodiment will be realized and attained by means of the elements and combinations particularly pointed out in the claims.

It is to be understood that both the foregoing general description and the following detailed description are exemplary and explanatory and are not restrictive of the embodiment, as claimed.

DESCRIPTION OF EMBODIMENT(S)

Preferred embodiments of the present invention will be explained with reference to accompanying drawings.

It should be noted that the composite power amplifier, the transmitter, and the composite-power-amplifier control method are not limited by the following embodiments.

Figure 1:
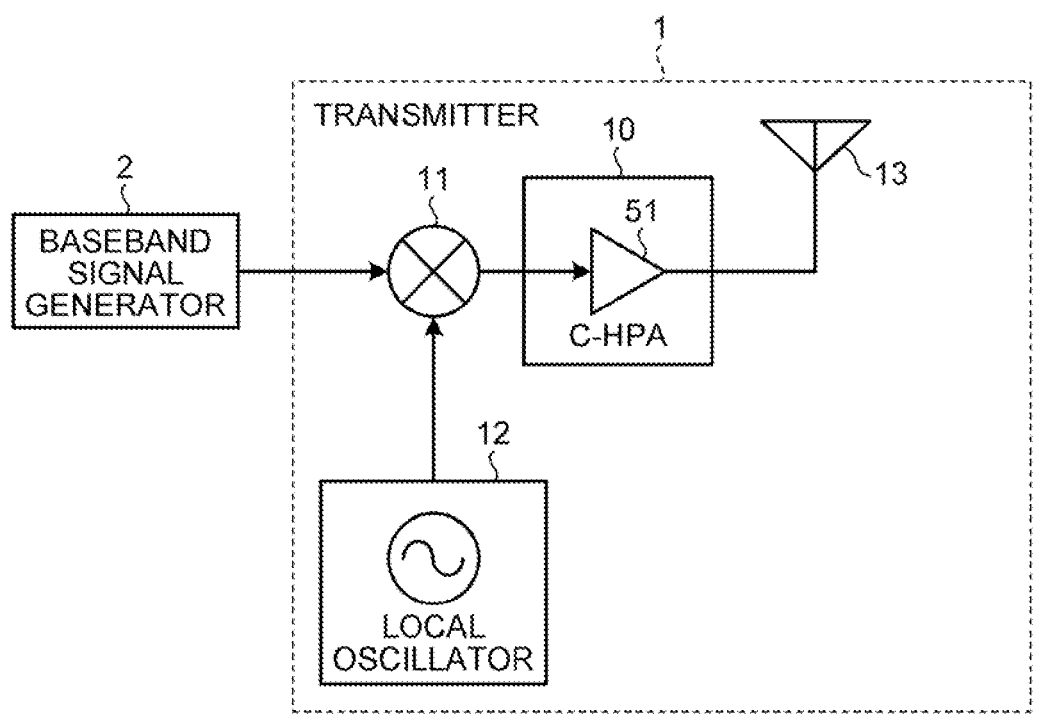
FIG. 1 is a diagram of an entire configuration of the transmitter.

FIG. 1 is a diagram of an entire configuration of the transmitter. As illustrated in FIG. 1, a transmitter 1 according to the present embodiment includes a C-HPA 10, a multiplier 11, a local oscillator 12, and an antenna 13. The transmitter 1 is installed in, for example, a base station. The overall operation of the transmitter 1 will be explained first with reference to FIG. 1. Thereafter, delay discrepancy estimation in the C-HPA 10 will be explained in detail below.

A baseband signal generator 2 generates a baseband signal based on input data such as speech, and outputs the generated baseband signal to the transmitter 1. The baseband signal generator 2 includes, for example, a digital circuit, a DSP (Digital Signal Processor), or a CPU (Central Processing Unit).

The multiplier 11 receives the baseband signal from the baseband signal generator 2, and further receives a local oscillation signal from the local oscillator 12. The multiplier 11 multiplies the baseband signal by a carrier frequency of the local oscillation signal, and converts the frequency to generate RF signal. The multiplier 11 outputs the generated RF signal to the C-HPA 10.

The C-HPA 10 includes an amplifier 51. Although only one amplifier is described in FIG. 1, the amplifier actually may include a plurality of amplifiers arranged in parallel. The C-HPA 10 receives the RF signal from the multiplier 11. In the C-HPA 10, the amplifier 51 amplifies the RF signal. At this time, the C-HPA 10 also performs a delay discrepancy estimation process, however, the details thereof will be explained later. The C-HPA 10 transmits the amplified signal through the antenna 13. This C-HPA 10 corresponds to one example of the "composite power amplifier".

Figure 2:
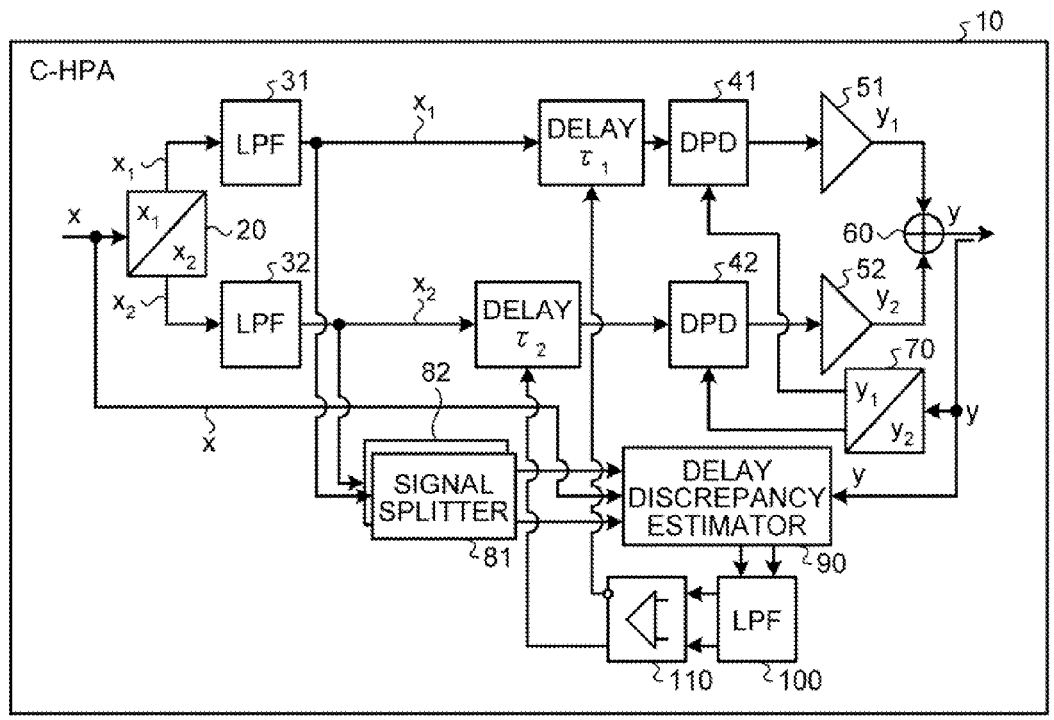
FIG. 2 is a block diagram of C-HPA according to an embodiment of the present invention.

FIG. 2 is a block diagram of the C-HPA according to the embodiment. As illustrated in FIG. 2, the C-HPA 10 includes an input-signal component separator 20, LPFs (Low Pass Filters) 31 and 32, DPDs 41 and 42, amplifiers 51 and 52, an adder 60, an output-signal component separator 70, signal splitters 81 and 82, a delay discrepancy estimator 90, an LPF 100, and a delay discrepancy adjuster 110. These components are connected to each other through signal lines so that signals and data may be input or output uni-directionally or bi-directionally.

When receiving a signal x, the input-signal component separator 20 separates the signal into $x_1$ and $x_2$, and generates separated signals to be output to the LPFs 31 and 32. As a method for separating the signal, for example, an outphasing method may be used. The input-signal component separator 20 includes, for example, a SCS (Signal Component Separator).

The LPFs 31 and 32 block frequency components of the input separated signals $x_1$ and $x_2$ higher than a predetermined frequency and pass only low frequency components therethrough as signals, respectively. As a result, noise in the harmonic of the input signal is removed. That is, the LPFs 31 and 32 remove the high-frequency components of the signal $x_1$ and $x_2$, being the x signal, separated by the input-signal component separator 20, and output only the low frequency components to the DPDs 41 and 42, respectively. The separated signals $x_1$ and $x_2$ are delayed by $\tau_1$ and $\tau_2$ in the process in which the signals are output from the LPFs 31 and 32 and then input to the DPDs 41 and 42, respectively.

The DPDs 41 and 42 estimate nonlinear distortions in the amplifiers 51 and 52 provided in the downstream and appropriately compensate the imbalance for amplitudes and phases having occurred between the separated signals $x_1$ and $x_2$, respectively, through digital signal processing. That is, the DPDs 41 and 42 calculate respective amplitudes of the separated signals $x_1$ and $x_2$ input from the LPFs 31 and 32, and compensate the distortions before the separated signals $x_1$ and $x_2$ are amplified, based on the calculation results and coefficients (distortion characteristic values) in order to compensate distorted signal components occurring in the C-HPA 10.

The amplifiers 51 and 52 receive the signals input from the DPDs 41 and 42, amplify these two input signals to each predetermined signal level with the common load, and output the amplified signals, respectively. Each of the amplifiers 51 and 52 includes an amplifying element such as transistor having predetermined power gain, impedance, frequency characteristic.

The adder 60 couples a signal $y_1$ and a signal $y_2$ sequentially input from the amplifiers 51 and 52, to generate y being an output with respect to the signal x received from the multiplier 11. The adder 60 outputs the generated signal y as feedback signal to an output-signal component separator 70 and the delay discrepancy estimator 90, and also transmits an output signal y as an amplified signal in which the delay discrepancy has been adjusted, through the antenna 13.

The output-signal component separator 70 again separates the output signal y coupled by the coupler 60 into the signal $y_1$ and the signal $y_2$, outputs the signal $y_1$ for distortion compensation to the DPD 41, and outputs the signal $y_2$ therefor to the DPD 42. The output-signal component separator 70 includes a SCS.

The signal splitter 81, 82 shift the separated signals $x_1$ and $x_2$ by a predetermined value $\pm\Delta$ in the time direction, to generate reference signals. That is, the signal splitter 81 splits the separated signal $x_1$ input from the LPF 31 into a signal $x_1(t+\Delta)$, in which the signal $x_1$ is put ahead $\Delta t$ in the time-axis direction, and a signal $x_1(t-\Delta)$ in which it is delayed $\Delta t$ in the time-axis direction. The signal splitter 81 then outputs the individual signals being an "early" signal and a "late" signal of the separated signal $x_1$. The signal splitter 81 includes a SCS. The signal splitter 82 performs the process similar to that for the signal splitter 81 on the separated signal $x_2$ input from the LPF 32. That is, the signal splitter 82 splits the separated signal $x_2$ into a signal $x_2(t+\Delta)$, in which the signal $x_2$ is put ahead $\Delta t$ in the time-axis direction, and a signal $x_2(t-\Delta)$ in which it is delayed $\Delta t$ in the time-axis direction. The signal splitter 82 then outputs the individual signals being an early signal and a late signal of the separated signal $x_2$.

The delay discrepancy estimator 90 receives the signals which are split into the early signal and the late signal by the signal splitters 81 and 82 respectively, the input signal x, and the feedback signal y, and estimates a discrepancy between the delays $\tau_1$ and $\tau_2$ based on these signals. The delay discrepancy estimator 90 then outputs the estimation result to the LPF 100. That is, the delay discrepancy estimator 90 calculates a difference $|\tau_1-\tau_2|$ between the delay $\tau_1$ and the delay $\tau_2$ output from adders 99a and 99b respectively, and estimates the calculation result as delay discrepancy between the separated signals $x_1$ and $x_2$. Here, the delays $\tau_1$ and $\tau_2$ are estimated by the following equations.

$$\tau_1 = x_1(t-\Delta) \cdot y_1^* - x_1(t+\Delta) \cdot y_1^*$$

$$\tau_2 = x_2(t-\Delta) \cdot y_2^* - x_2(t+\Delta) \cdot y_2^*$$

Figure 3:
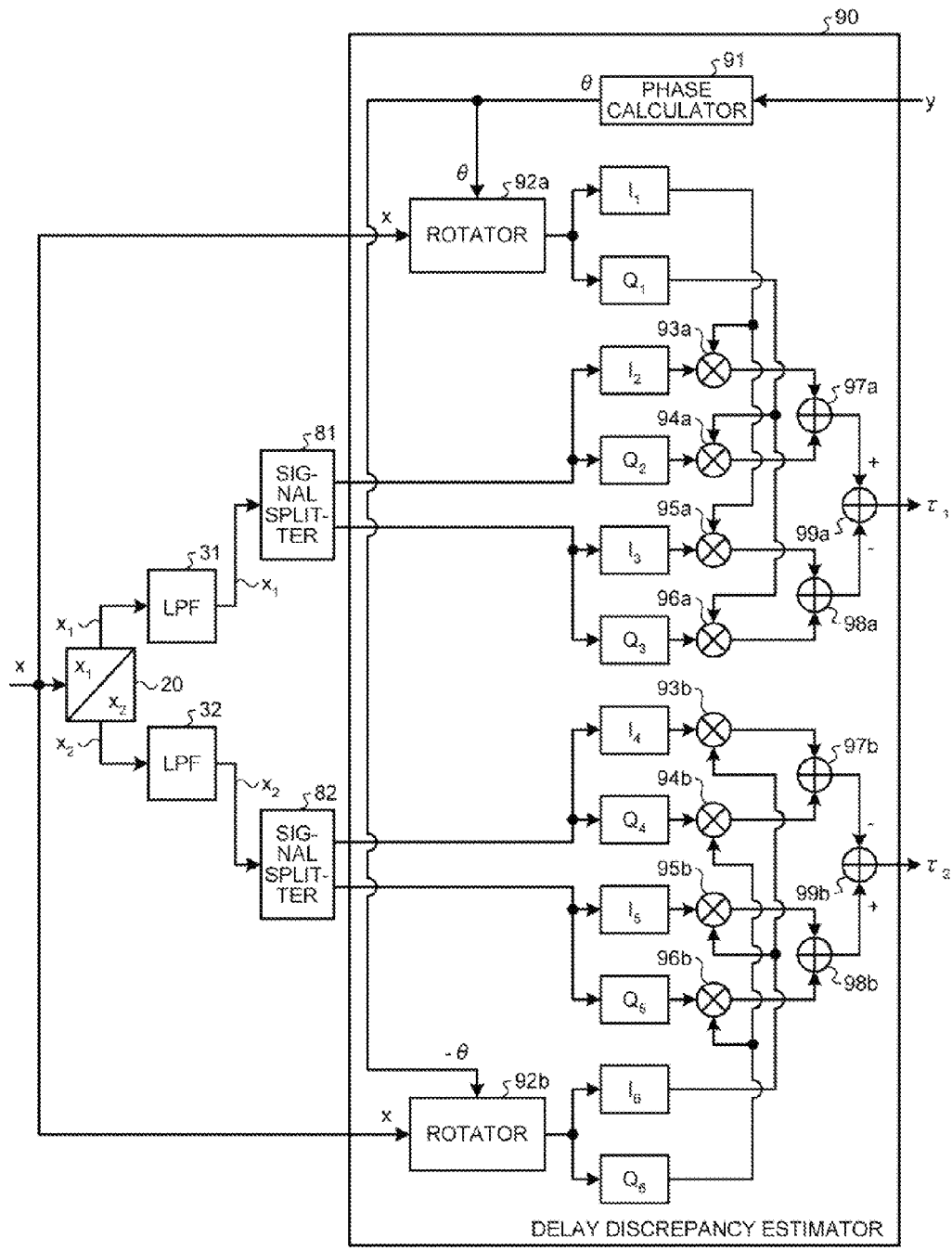
FIG. 3 is a block diagram of a delay discrepancy estimator of the C-HPA according to the embodiment.

FIG. 3 is a block diagram of the delay discrepancy estimator 90 of the C-HPA 10 according to the embodiment. As illustrated in FIG. 3, the delay discrepancy estimator 90 includes a phase calculator 91, Rotators 92a and 92b, multipliers 93a through 96a, multipliers 93b through 96b, adders 97a through 99a, and adders 97b through 99b. These components are connected to each other through signal lines so that signals and data may be input or output uni-directionally or bi-directionally.

The phase calculator 91 calculates a phase θ of the feedback signal y based on the feedback signal y and amplitude A. The phase θ is calculated by $\theta = \cos^{-1}(y/A)$, where A is a constant defined by maximum amplitude of the input signal x. That is, the phase calculator 91 calculates the phase of the combined output signal (feedback signal) using the maximum amplitude of the input signal. The phase calculator 91 decomposes the feedback signal with $\cos^{-1}(y/A)$, and thereby eliminates negative influence of unknown RF (Radio Frequency) phase in the feedback signal on the delay discrepancy estimation.

The Rotator 92a outputs the signal $y_1^*$ based on the input signal x into the C-HPA 10 and the input θ from the phase calculator 91. That is, the Rotator 92a separates the input signal x by a predetermined angle +θ, and rotates the feedback signal y as the signal $y_1^* = \text{rotate}(x, +\theta)$. The Rotator 92b receives −θ as a sign being the reverse of the output result by the phase calculator 91, and outputs the signal $y_2^*$ based on the input signal x into the C-HPA 10 and −θ. That is, the Rotator 92b separates the input signal x by a predetermined angle −θ, and rotates the feedback signal y as the signal $y_2^* = \text{rotate}(x, -\theta)$.

The multiplier 93a receives a real part $I_1$ of the signal $y_1^*$ being the output result of the Rotator 92a and a real part $I_2$ of the early signal in the signals output from the signal splitter 81, and outputs $I_1 \times I_2$ being the result of multiplication of these real parts. Likewise, the multiplier 93b in the $x_2$ side receives a real part $I_6$ of the signal $y_2^*$ being the output result of the Rotator 92b and a real part $I_4$ of the early signal in the signals output from the signal splitter 82, and outputs $I_6 \times I_4$ being the result of multiplication of these real parts.

The multiplier 94a performs the same process as that of the multiplier 93a on an imaginary part. That is, the multiplier 94a receives an imaginary part $Q_1$ of the signal $y_1^*$ being the output result of the Rotator 92a and an imaginary part $Q_2$ of the early signal in the signals output from the signal splitter 81, and outputs $Q_1 \times Q_2$ being the result of multiplication of these imaginary parts. Likewise, the multiplier 94b in the $x_2$ side performs the same process as that of the multiplier 93b on each imaginary part of the signals. That is, the multiplier 94b receives an imaginary part $Q_6$ of the signal $y_2^*$ being the output result of the Rotator 92b and an imaginary part $Q_4$ of the early signal in the signals output from the signal splitter 82, and outputs $Q_6 \times Q_4$ being the result of multiplication of these imaginary parts.

The multipliers 95a and 95b perform the same processes as these of the multipliers 94a and 94b on the late signals of the signals output from the signal splitters 81 and 82, respectively. That is, the multiplier 95a multiplies a real part $I_3$ of the late signal split from the signal $x_1$ by the real part $I_1$ of the output signal from the Rotator 92a, and outputs $I_1 \times I_3$ as the result of multiplication. Likewise, the multiplier 95b multiplies a real part $I_5$ of the late signal split from the signal $x_2$ by the real part $I_6$ of the output signal from the Rotator 92b, and outputs $I_5 \times I_6$ as the result of multiplications. Moreover, the multipliers 96a and 96b perform the same processes as these of the multiplier 95a and 95b on the imaginary parts of the signals, respectively. That is, the multiplier 96a multiplies an imaginary part $Q_3$ of the late signal split from the signal $x_1$ by the imaginary part $Q_1$ of the output signal from the Rotator 92a, and outputs $Q_1 \times Q_3$ as the result of multiplication. Likewise, the multiplier 96b multiplies an imaginary part $Q_5$ of the late signal split from the signal $x_2$ by the imaginary part $Q_6$ of the output signal from the Rotator 92b, and outputs $Q_5 \times Q_6$ as the result of multiplication.

The adder 97a adds the real part input from the multiplier 93a and the imaginary part input from the multiplier 94a, and outputs the result of addition as a complex correlation of the early signal in the signal $x_1$ to the adder 99a. Likewise, the adder 98a adds the real part input from the multiplier 95a and the imaginary part input from the multiplier 96a, and outputs the result of addition as a complex correlation of the late signal in the signal $x_1$ to the adder 99a. The adder 99a further adds the results of additions input from the adder 97a and the adder 98a, and outputs the delay $\tau_1$ to which the complex correlations are reflected.

The adder 97b performs the same process as that of the adder 97a on the signal $x_2$. That is, the adder 97b adds the real part input from the multiplier 93b and the imaginary part input from the multiplier 94b, and outputs the result of addition as a complex correlation of the late signal in the signal $x_2$ to the adder 99b. The adder 98b performs the same process as that of the adder 98a on the signal $x_2$. That is, the adder 98b adds the real part input from the multiplier 95b and the imaginary part input from the multiplier 96b, and outputs the result of addition as a complex correlation of the late signal in the signal $x_2$ to the adder 99b. The adder 99b further adds the results of additions input from the adder 97b and the adder 98b, and outputs the delay $\tau_2$ to which the complex correlations are reflected.

The LPF 100 blocks the frequency component higher than the predetermined frequency, of the signals input from the delay discrepancy estimator 90, and passes only a low frequency component therethrough as a signal, to remove noise in the harmonic of the input signal. That is, the LPF 100 removes the high-frequency component of a result of delay discrepancy estimation implemented by the delay discrepancy estimator 90, and outputs only the low frequency component to the delay discrepancy adjuster 110. The LPF 100 functions as a low-pass filtering unit for removing a signal component that exceeds the predetermined frequency, of signals indicating delay discrepancy estimated by the delay discrepancy estimator 90, to thereby average results of estimating delay discrepancies and to mitigate estimation errors caused by noise feedback. This allows the high-precision estimation of the delay discrepancy to be maintained.

The delay discrepancy adjuster 110 adjusts a difference between the delays $\tau_1$ and $\tau_2$ occurring between the two arms, based on the delay estimation result input from the LPF 100. That is, the delay discrepancy adjuster 110 compares the delay $\tau_1$ and the delay $\tau_2$. If $\tau_1 > \tau_2$, then the delay $\tau_1$ is decreased and the delay $\tau_2$ is increased until the delays become $\tau_1 = \tau_2$. On the other hand, if $\tau_1 < \tau_2$, then the delay $\tau_1$ is increased and the delay $\tau_2$ is decreased until the delays become $\tau_1 = \tau_2$. In the embodiment, the case of two separated signals is assumed, and therefore the delay discrepancy of objects to be adjusted is calculated as $|\tau_1 - \tau_2|$, however, if the input signal is separated into n lines, then the delay discrepancy adjuster 110 adjusts the discrepancy between each of the separated signals and reference delay τ by (n−1).

Figure 4:
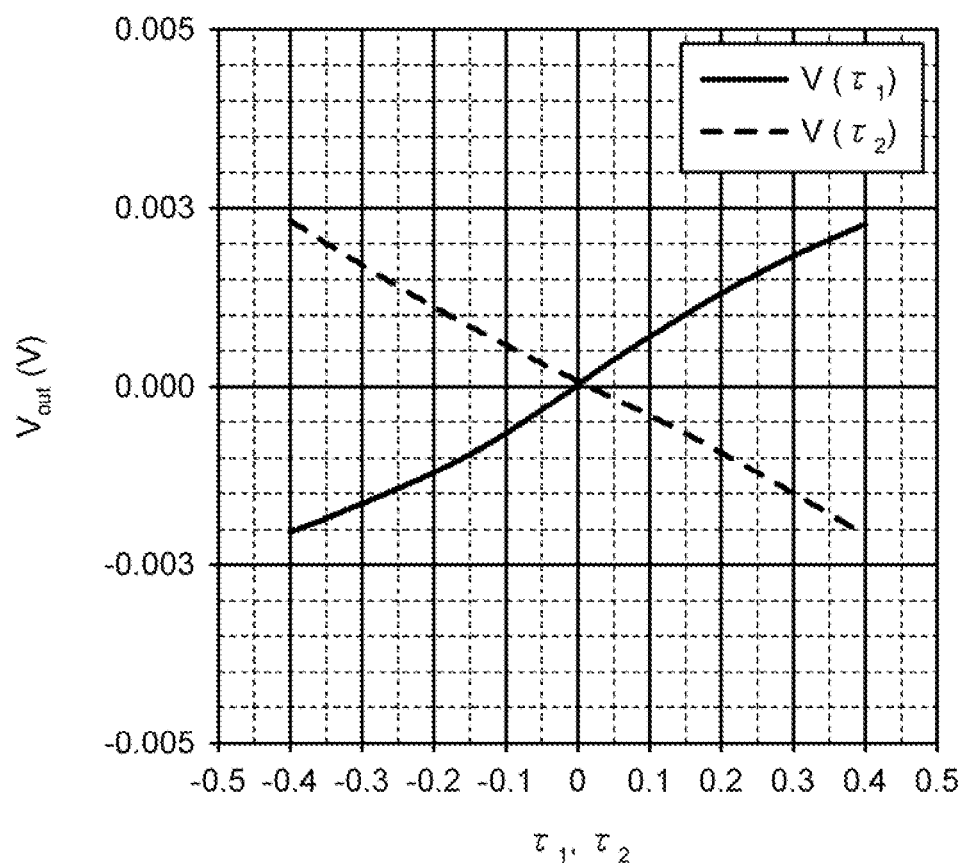
FIG. 4 is a diagram illustrating a relationship between delay and output voltage when the C-HPA according to the embodiment is applied.

FIG. 4 is a diagram illustrating a relationship between a delay and an output voltage when the C-HPA according to the embodiment is applied. In FIG. 4, the delay $\tau_1$ that may occur in the input signal $x_1$ after being separated and the delay $\tau_2$ that may occur in the input signal $x_2$ after being separated are defined in the x-axis, and an output voltage $V_{out}(V)$ is defined in the y-axis. In this figure, a change of the voltage V ($\tau_1$) with the change of the delay $\tau_1$ is indicated by a solid line and a change of the voltage V ($\tau_2$) with the change of the delay $\tau_2$ is indicated by a broken line. Because the delays $\tau_1$ and $\tau_2$ of the separated input signals and the output voltages have a correlation illustrated in FIG. 4, the delay discrepancy estimator 90 of the C-HPA 10 cancels the imbalance between the delays $\tau_1$ and $\tau_2$.

Figure 5A:
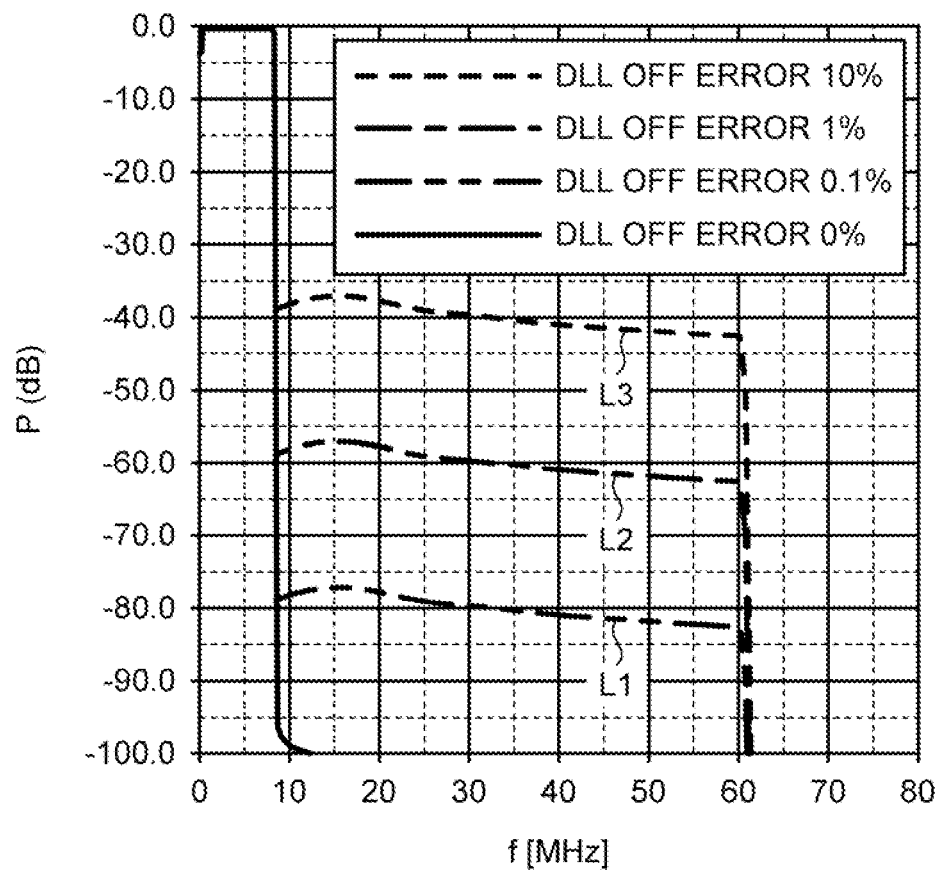
FIG. 5A is a diagram illustrating a relationship between out-of-band frequencies and power based on the related example.
Figure 5B:
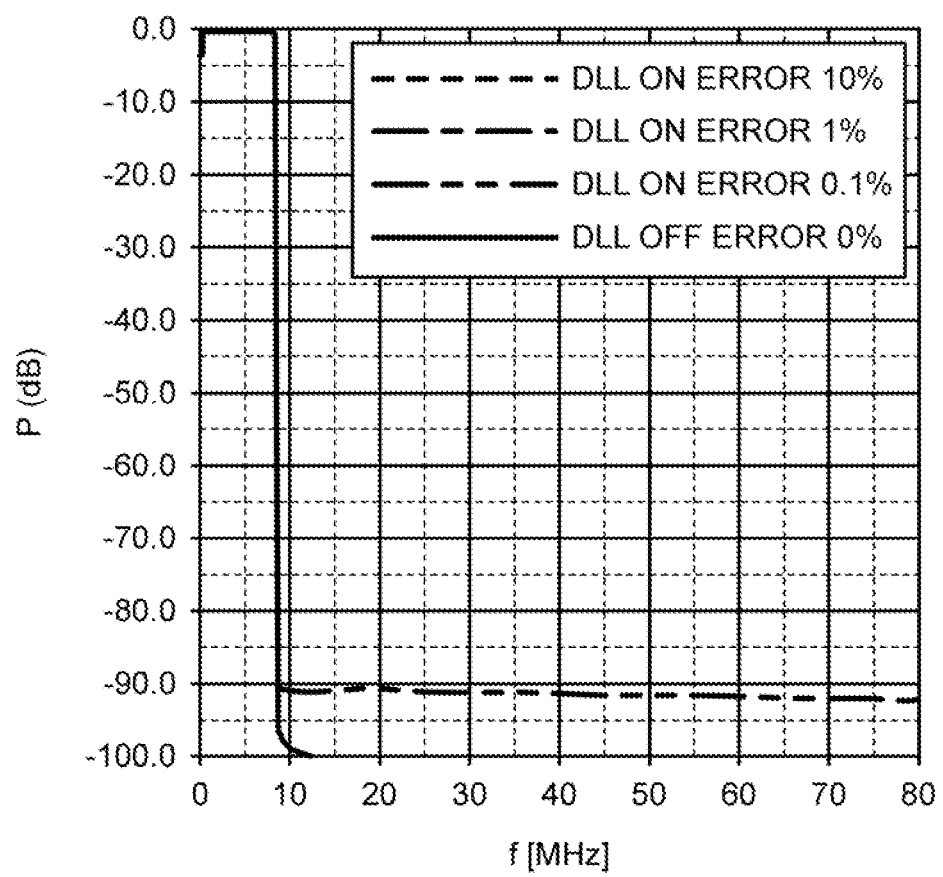
FIG. 5B is a diagram illustrating a relationship between out-of-band frequencies and power when the C-HPA according to the embodiment is applied.
Figure 6:
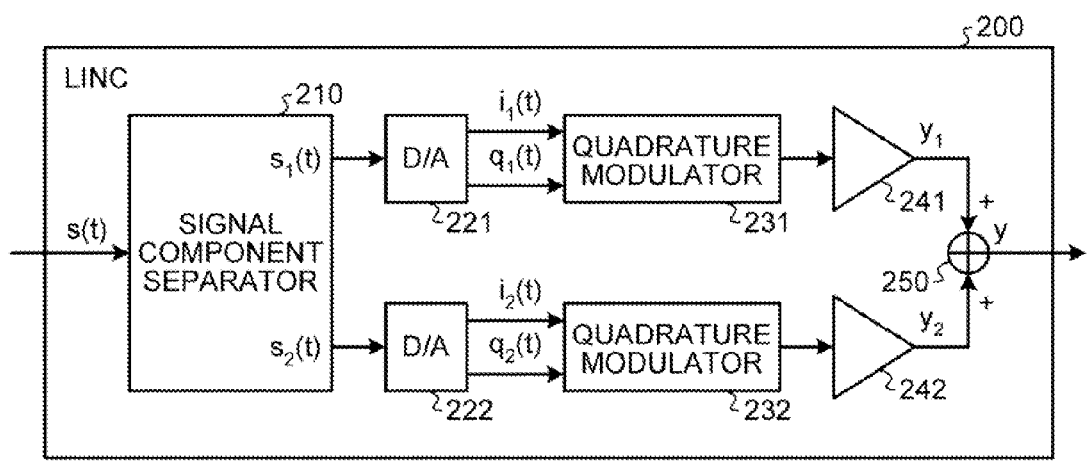
FIG. 6 is a block diagram of LINC based on the related example.
Figure 7:
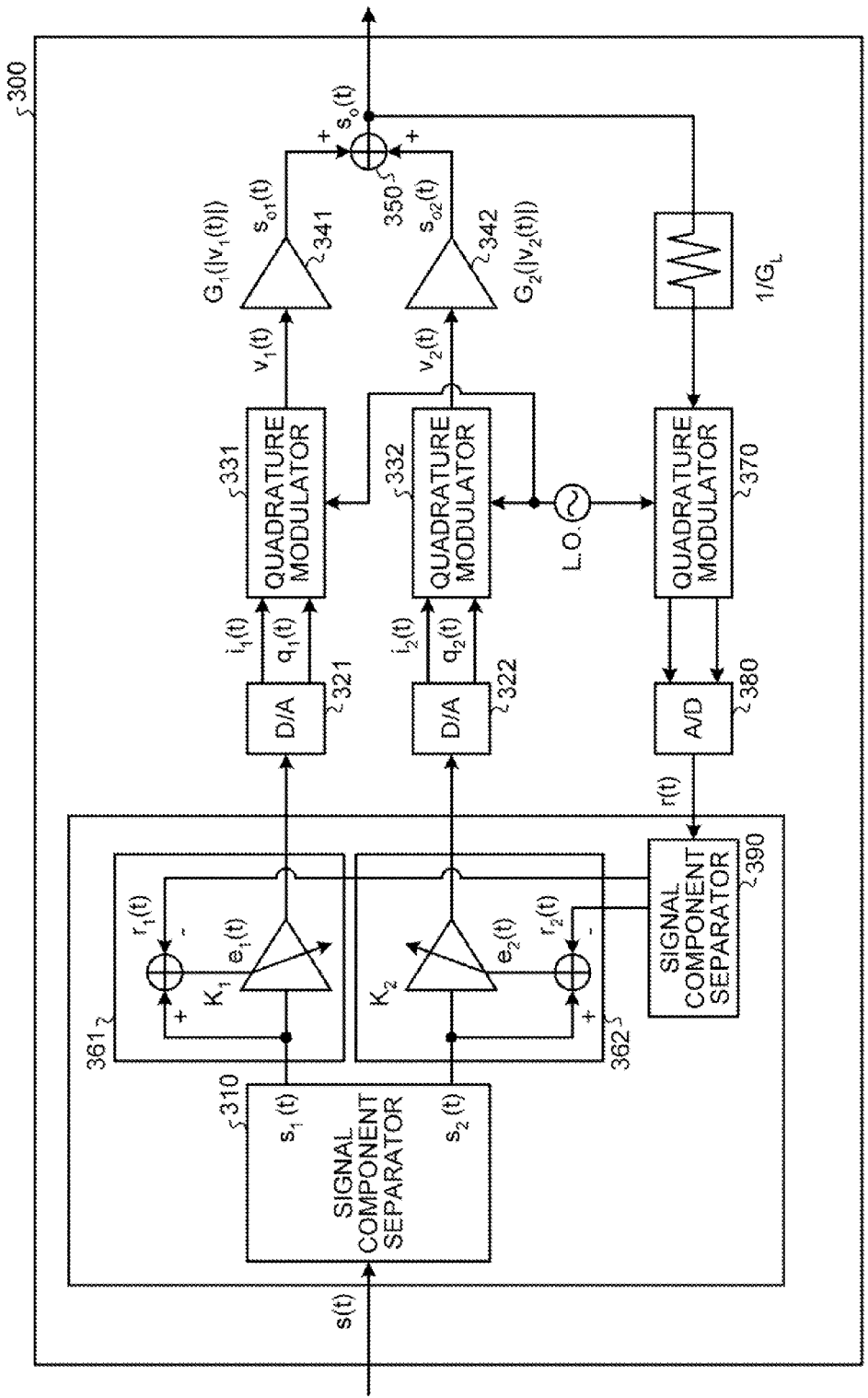
FIG. 7 is a diagram of a process in which the LINC based on the related example compensates amplitude and phase discrepancies.

The effect of the delay discrepancy adjustment process implemented by the C-HPA 10 will be explained below with reference to FIG. 5A and FIG. 5B. FIG. 5A is a diagram illustrating a relationship between out-of-band frequencies and power based on the related example, while FIG. 5B is a diagram illustrating a relationship between out-of-band frequencies and power when the C-HPA according to the embodiment is applied. In FIG. 5A and FIG. 5B, a frequency f(MHz) of an output signal is defined in the x-axis, and power P(dB) is defined in the y-axis. In FIG. 5A, because the delay discrepancy is not adjusted, the spectrum at the out-of-band frequency exceeding 10 MHz, which is supposed to be decreased, significantly increases with an increase of the delay discrepancy. On the other hand, in FIG. 5B, because the delay discrepancy between separate arms is adjusted, the influence of the delay discrepancy is suppressed, and the out-of-band spectrum shows low values in a wide range. More specifically, when the signal is amplified without using the C-HPA 10 according to the embodiment, the signals indicated by chain lines L1, L2, and L3 occur in association with an increase in the error rate. As illustrated in the chain lines L1, L2, and L3, when ordinary amplification is performed, the attenuation at specific frequency band of 10 to 60 MHz decreases, which causes a large signal to be output. On the other hand, when the signal is amplified using the C-HPA 10 according to the embodiment, the attenuation may be increased over the whole area of extra offset frequency. This allows suppression of unnecessary signal as compared with the case of normal amplification in which the delay discrepancy is not adjusted.

As explained above, the C-HPA 10 according to the embodiment separates the input signal (original signal) into signals, and amplifies and combines the signals. The C-HPA 10 includes the signal splitters 81 and 82, the delay discrepancy estimator 90, and the delay discrepancy adjuster 110. Each of the signal splitters 81 and 82 splits each of the separated signals into a signal in which the time component of the separated signal is put ahead a predetermined time and a signal in which the time component of the separated signal is delayed the predetermined time, and outputs the split signals. The delay discrepancy estimator 90 uses the input signal, the split signals output from each of the signal splitters 81 and 82, and the combined output signal (feedback signal) to estimate delay discrepancy between the separated signals. The delay discrepancy adjuster 110 uses the estimated delay discrepancy to adjust the delay discrepancy between the separated signals. In order that the C-HPA 10 suppresses leakage of the signals into the adjacent channels and increases the input signal, it is preferable to suppress the delay discrepancy of the input signals once separated, to a value as small as possible, and to combine the signals. In order to achieve this, the difference in transport delays between the separated input signals $x_1$ and $x_2$ is made preferably the same as each other. According to the C-HPA 10, the delay discrepancy estimator 90 calculates a complex correlation between the signal, calculated using the phase of the combined output signal and the input signal, and the signals output from each of the signal splitters 81 and 82. This allows the delay discrepancy estimator 90 to estimate delay discrepancy between the separated signals. The delay discrepancy adjuster 110 adjusts the delay discrepancy based on the result of estimation, thus suppressing the increase in the level of the out-of-band spectrum. Therefore, the C-HPA 10 allows reduced interference with the adjacent channels or improved use efficiency of the frequencies in the out-of-band area.

The above embodiment has explained the example in which the C-HPA 10 has the two amplifiers 51 and 52, however, the C-HPA 10 may have n-pieces (n≥3) of amplifiers.

According to one aspect of the composite power amplifier disclosed in the application, the out-of-band spectrum of the output signal may be decreased.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A composite power amplifier that separates an input signal into separated signals, and amplifies and combines the separated signals, the composite power amplifier comprising:
a plurality of signal splitters that split each of the separated signals into a signal in which a time component of the separated signal is put ahead a predetermined time and a signal in which the time component of the separated signal is delayed the predetermined time, and outputs split signals;
an estimator that estimates delay discrepancy between the separated signals by using the input signal, the split signals output from each of the signal splitters, and a combined output signal; and
an adjustor that adjusts the delay discrepancy between the separated signals by using the estimated delay discrepancy without information regarding an amplitude delay and a phase error, wherein
the estimator includes:
a phase calculator;
a first rotator that outputs a first signal based on the input signal into the composite power amplifier and input θ from the phase calculator; and
a second rotator that receives −θ as a sign being the reverse of an output result by the phase calculator, and outputs a second signal based on the input signal into the composite power amplifier and −θ, wherein
in the composite power amplifier, a linear amplification with nonlinear components (LINC) amplifier feedback signal is not used directly in early-late system and is used only for phase rotation control.

2. The composite power amplifier according to the claim 1, the estimator estimating the delay discrepancy between the separated signals by calculating a complex correlation between a signal, calculated using a phase of the combined output signal and also using the input signal, and the split signals output from each of the signal splitters.

3. The composite power amplifier according to the claim 2, the estimator including a phase calculator that calculates a phase of the combined output signal using maximum amplitude of the input signal.

4. The composite power amplifier according to the claim 1, further comprising a low-pass filtering unit that removes a signal component exceeding a predetermined frequency, of signals indicating the delay discrepancy estimated by the estimator.

5. A transmitter comprising:
a composite power amplifier that separates an input signal into separated signals, and amplifies and combines the separated signals, the composite power amplifier including:
 a plurality of signal splitters that split each of the separated signals into a signal in which a time component of the separated signal is put ahead a predetermined time and a signal in which the time component of the separated signal is delayed the predetermined time, and outputs split signals;
 an estimator that estimates delay discrepancy between the separated signals by using the input signal, the split signals output from each of the signal splitters, and a combined output signal; and
 an adjustor that adjusts the delay discrepancy between the separated signals by using the estimated delay discrepancy without information regarding an amplitude delay and a phase error; and
a transmitting unit that transmits the output signal of which delay discrepancy is adjusted by the composite power amplifier, wherein
the estimator includes:
 a phase calculator;
 a first rotator that outputs a first signal based on the input signal into the composite power amplifier and input θ from the phase calculator; and
 a second rotator that receives −θ as a sign being the reverse of an output result by the phase calculator, and outputs a second signal based on the input signal into the composite power amplifier and −θ, wherein
in the composite power amplifier, a linear amplification with nonlinear components (LINC) amplifier feedback signal is not used directly in early-late system and is used only for phase rotation control.

6. A composite-power-amplifier control method implemented by a composite power amplifier that separates an input signal into separated signals, and amplifies and combines the separated signals, the method comprising:
 splitting each of the separated signals into a signal in which a time component of the separated signal is put ahead a predetermined time and a signal in which the time component of the separated signal is delayed the predetermined time, and outputting split signals;
 estimating delay discrepancy between the separated signals by using the input signal, the split signals output as a result of splitting, and a combined output signal; and
 adjusting the delay discrepancy between the separated signals by using the estimated delay discrepancy without information regarding an amplitude delay and a phase error, wherein
the estimating includes:
 calculating a phase;
 outputting a first signal based on the input signal into the composite Power amplifier and input θ at the calculating; and
 receiving −θ as a sign being the reverse of an output result at the calculating, and outputting a second signal based on the input signal into the composite power amplifier and −θ, wherein
in the composite power amplifier, a linear amplification with nonlinear components (LINC) amplifier feedback signal is not used directly in early-late system and is used only for phase rotation control.

* * * * *